(12) United States Patent
Ji et al.

(10) Patent No.: US 11,276,710 B2
(45) Date of Patent: Mar. 15, 2022

(54) PANEL, ELECTRONIC DEVICE AND TRANSISTOR

(71) Applicant: LG Display Co. Ltd., Seoul (KR)

(72) Inventors: Kwanghwan Ji, Incheon (KR); HongRak Choi, Seoul (KR); Jeyong Jeon, Gyeonggi-do (KR); Jaeyoon Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/659,528

(22) Filed: Oct. 21, 2019

(65) Prior Publication Data

US 2020/0144304 A1 May 7, 2020

(30) Foreign Application Priority Data

Nov. 1, 2018 (KR) .................. 10-2018-0133089

(51) Int. Cl.
| | |
|---|---|
| *H01L 27/12* | (2006.01) |
| *H01L 29/417* | (2006.01) |
| *H01L 29/45* | (2006.01) |
| *H01L 29/66* | (2006.01) |
| *H01L 29/78* | (2006.01) |
| *H01L 49/02* | (2006.01) |
| *H01L 29/786* | (2006.01) |

(52) U.S. Cl.
CPC ...... *H01L 27/1225* (2013.01); *H01L 27/1255* (2013.01); *H01L 27/1288* (2013.01); *H01L 28/60* (2013.01); *H01L 29/41733* (2013.01); *H01L 29/45* (2013.01); *H01L 29/66969* (2013.01); *H01L 29/7869* (2013.01)

(58) Field of Classification Search
CPC ............. H01L 27/1225; H01L 27/1255; H01L 29/41733; H01L 29/45; H01L 29/66969; H01L 29/7869
See application file for complete search history.

(56) References Cited

U.S. PATENT DOCUMENTS

| | | | | |
|---|---|---|---|---|
| 2008/0128689 | A1* | 6/2008 | Lee | ..................... H01L 29/7869 257/43 |
| 2008/0225190 | A1* | 9/2008 | Chen | ................. G02F 1/136213 349/38 |
| 2013/0126882 | A1* | 5/2013 | You | ....................... H01L 27/124 257/71 |
| 2015/0123111 | A1* | 5/2015 | Tseng | ................ H01L 29/42384 257/43 |
| 2015/0303308 | A1* | 10/2015 | Wei | ..................... H01L 27/1225 257/43 |
| 2017/0104089 | A1* | 4/2017 | Koezuka | ............. H01L 29/7782 |
| 2019/0123121 | A1* | 4/2019 | Liu | ..................... H01L 27/3246 |

* cited by examiner

*Primary Examiner* — Christine A Enad
(74) *Attorney, Agent, or Firm* — Morgan, Lewis & Bockius LLP

(57) ABSTRACT

A panel comprises a substrate; a transistor disposed on the substrate and including: a source electrode, a drain electrode, a gate electrode, a gate insulation layer, an active layer, an auxiliary source electrode configured to electrically connect one end of the active layer to the source electrode, and an auxiliary drain electrode configured to electrically connect an other end of the active layer to the drain electrode; and a capacitor disposed on the substrate and including a first plate and a second plate. The first plate of the capacitor is made of a same material as the auxiliary source electrode and the auxiliary drain electrode.

18 Claims, 8 Drawing Sheets

PANEL, ELECTRONIC DEVICE AND TRANSISTOR

CROSS REFERENCE TO RELATED APPLICATION

This application claims priority from Korean Patent Application No. 10-2018-0133089, filed on Nov. 1, 2018, which is hereby incorporated by reference for all purposes as if fully set forth herein.

BACKGROUND

1. Technical Field

The present disclosure relates to a panel, electronic device and transistor.

2. Description of Related Art

As the information society develops, the demand for various forms of electronic devices such as display devices and lighting devices is increasing. One example of such an electronic device may include a panel having a transistor and a capacitor for driving a pixel, and a driving circuit for driving the panel.

The patterning process of the panel with the transistor and the capacitor may include a plurality of processes, such as a deposition process and etching process. For example, the patterning process of the panel may include a deposition step, a photoresist coating step, an exposure step using the mask, an etching step, etc.

However, in the patterning process of the panel, the number of required masks may be increased, and thereby the process may be complicated and the cost for the patterning process may increase. In addition, the pattern formed on the panel may exhibit physical properties different from those expected by an etching process, or the defects may occur in the pattern by the etching process.

Therefore, research has been conducted on display panels capable of being manufactured by a simple process.

SUMMARY

Accordingly, the present disclosure is directed to a panel, electronic device and transistor that substantially obviates one or more of the problems due to limitations and disadvantages of the related art.

An aspect of embodiments of the present disclosure is to provide a panel including a transistor and a capacitor.

An another aspect of embodiments of the present disclosure is to provide the panel or the display panel capable of being manufactured by a process using a small number of masks.

An another aspect of embodiments of the present disclosure is to provide an electronic device including the panel or the display panel capable of being manufactured by the process using a small number of masks.

An another aspect of embodiments of the present disclosure is to provide a transistor capable of being manufactured by the process using a small number of masks.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages and in accordance with the purpose of the present disclosure, as embodied and broadly described, a panel comprises a substrate; a transistor disposed on the substrate and including: a source electrode, a drain electrode, a gate electrode, a gate insulation layer, an active layer, an auxiliary source electrode configured to electrically connect one end of the active layer to the source electrode, and an auxiliary drain electrode configured to electrically connect an other end of the active layer to the drain electrode; and a capacitor disposed on the substrate and including a first plate and a second plate. The first plate of the capacitor is made of a same material as the auxiliary source electrode and the auxiliary drain electrode.

According to another aspect, an electronic device comprises a panel; and a driving circuit configured to drive the panel, wherein the panel includes a substrate, a capacitor disposed on the substrate and including a first plate and a second plate, and a transistor disposed on the substrate, the transistor including: a source electrode, a drain electrode, a gate electrode, a gate insulation layer, an active layer, an auxiliary source electrode configured to electrically connect one end of the active layer to the source electrode, and an auxiliary drain electrode configured to electrically connect an other end of the active layer to the drain electrode, wherein the first plate of the capacitor is composed of a same material as the auxiliary source electrode and the auxiliary drain electrode.

According to another aspect, a transistor on a substrate comprises an auxiliary source electrode disposed on the substrate; an auxiliary drain electrode disposed apart from the auxiliary source electrode on the substrate; an active layer disposed on the substrate and including one end that contacts an end of the auxiliary source electrode and an other end that contacts an end of the auxiliary drain electrode; a gate insulation layer disposed on the active layer; a gate electrode disposed on the gate insulation layer and overlapping the active layer; an interlayer insulation film disposed to cover the gate electrode; a source electrode in contact with the auxiliary source electrode through a hole in the interlayer insulation film and the gate insulation layer; and a drain electrode in contact with the auxiliary drain electrode through another hole in the interlayer insulation film and the gate insulation layer.

According to the embodiments of the present disclosure, it is possible to provide the panel including a transistor and a capacitor.

In addition, according to the embodiments of the present disclosure, it is possible to provide the panel or the display panel capable of being manufactured by the process using a small number of masks.

In addition, according to the embodiments of the present disclosure, it is possible to provide the electronic device including the panel capable of being manufactured by the process using a small number of masks.

In addition, according to the embodiments of the present disclosure, it is possible to provide the transistor capable of being manufactured by the process using a small number of masks.

According to embodiments of the present disclosure, it is possible to provide the panel having the transistor including the auxiliary source electrode electrically connecting one end of the active layer and the source electrode and an auxiliary drain electrode electrically connecting the other end of the active layer and the drain electrode, thereby the channel length of the transistor can be reduced and the electron mobility can be enhanced.

In addition, according to the embodiments of the present disclosure, it is possible to provide a panel in which the first plate of the capacitor is made of the same material as the auxiliary source electrode and the auxiliary drain electrode, thereby the manufacturing process can be simplified.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION OF THE EXAMPLE EMBODIMENTS

Figure 1:
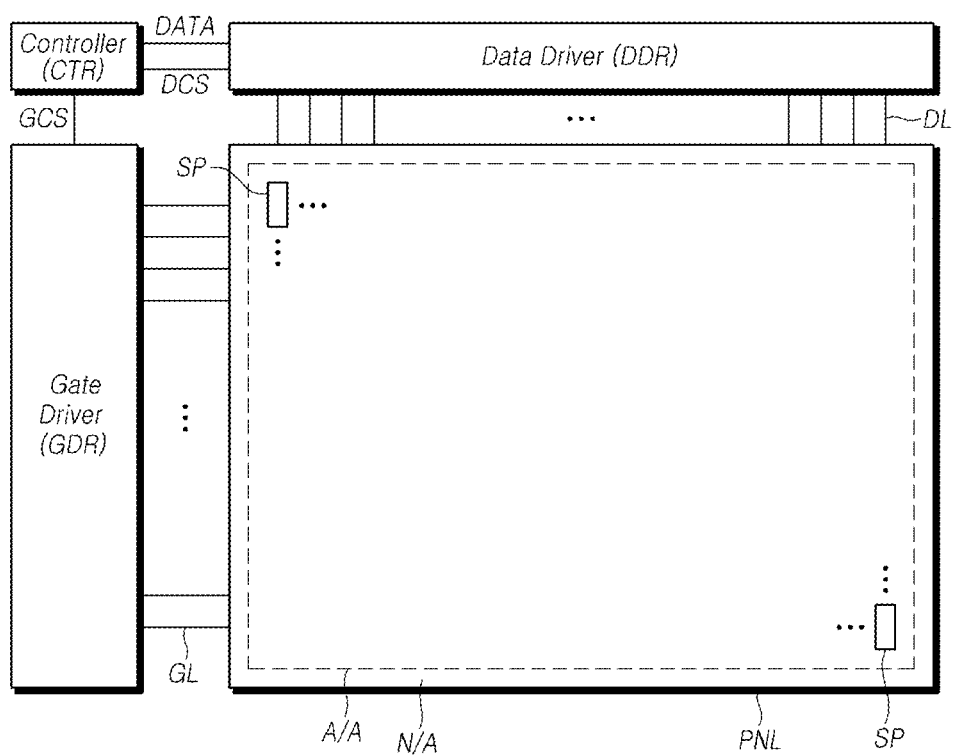
FIG. 1 is a schematic diagram illustrating a system configuration of an electronic device according to embodiments of the present disclosure.

Reference will now be made in detail to embodiments of the present disclosure, examples of which are illustrated in the accompanying drawings.

In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to," "is coupled to," or "is in contact with" another structural element, it should be interpreted that another structural element may "be connected to," "be coupled to," or "be in contact with" the structural elements as well as that the certain structural element is directly connected to or is in direct contact with another structural element.

FIG. 1 is a schematic diagram illustrating a system configuration of an electronic device according to embodiments of the present disclosure.

The electronic device according to embodiments of the present disclosure may include a display device, a lighting device, a light emitting device, and the like. Hereinafter, for convenience of explanation, the display device will be mainly described as the representative example of an electronic device. However, the present disclosure may be similarly applied to various other types of electronic devices, such as the lighting device and the light emitting device that include the transistor according to embodiments of the present disclosure.

The electronic device according to embodiments of the present disclosure may include a panel (PNL) for displaying an image or outputting light, and a driving circuit for driving the panel (PNL). The panel (PNL) may include a plurality of data lines (DL), a plurality of gate lines (GL), and a plurality of subpixel (SP) defined by the plurality of data lines (DL) and a plurality of gate lines (GL) and arranged in a matrix type.

In the panel (PNL), the plurality of data lines (DL) and the plurality of gate lines (GL) may be arranged to cross each other. As an example, the plurality of gate lines (GL) may be arranged in a row or a column, and the plurality of data lines (DL) may be arranged in the other of a column or a row. Hereinafter, for convenience of explanation, it is assumed that the plurality of gate lines (GL) are arranged in a row and the plurality of data lines (DL) are arranged in a column.

In the panel (PNL), other types of signal lines may be arranged in addition to the plurality of data lines (DL) and the plurality of gate lines (GL), depending on the subpixel structure or the like. For example, a driving voltage line, a reference voltage line, and a common voltage line or the like may be further disposed.

The panel (PNL) may be various types of panels such as the LCD (Liquid Crystal Display) panel, the OLED (Organic Light Emitting Diode) panel, and the like.

The types of signal lines arranged in the panel (PNL) may vary depending on the subpixel structure, the panel type (eg, LCD panel, OLED panel etc.) and the like. In this specification, a signal line may be a concept including the electrode to which a signal is applied.

The panel (PNL) may include an active area (A/A) in which an image is displayed, and a non-active area (N/A) in which the image is not displayed. Here, the non-active area (N/A) may be also referred to a bezel area.

A plurality of subpixels (SP) for displaying the image may be arranged in the active area (A/A). A pad portion for electrically connecting to the data driver (DDR) may be disposed in the non-active area (N/A) as well as a plurality of data link lines for connecting the pad portion to the plurality of data lines (DL). Here, the plurality of data link lines may be portions extending from the plurality of data lines (DL) to the non-active region (N/A), or may be separate patterns electrically connected to the plurality of data lines (DL).

In addition, the gate drive-related lines for transferring a voltage (signal) required for gate driving to the gate driver (GDR) through the pad portion electrically connected to the data driver (DDR) may be arranged in the non-active area (N/A). For example, the gate drive-related lines may include clock lines for transferring clock signals, gate voltage lines for transferring gate voltages (VGH, VGL), gate drive control signal lines for transferring various control signals required for generating scan signals and the like. These gate drive-related lines may be arranged in the non-active area (N/A), unlike the gate lines (GL) arranged in the active area (A/A).

The driving circuit may include the data driver (DDR) for driving the plurality of data lines (DL), the gate driver (GDR) for driving the plurality of gate lines (GL), and a controller (CTR) for controlling the data driver (DDR) and the gate driver (GDR).

The data driver (DDR) may drive the plurality of data lines (DL) by outputting a data voltage to the plurality of data lines (DL), and the gate driver (GDR) may drive the plurality of gate lines (GL) by outputting scan signals to the plurality of gate lines (GL).

The controller (CTR) may supply various types of control signals (DCS, GCS) for the driving operation of the data driver (DDR) and the gate driver (GDR) to control the driving operation of the data driver (DDR) and the gate driver (GDR). Furthermore, the controller (CTR) may supply the image data (DATA) to the data driver (DDR).

The controller CTR may start scanning in accordance with the timing implemented in each frame, may convert the image data inputted from the outside according to the data signal format used in the data driver (DDR), and may output the converted image data (DATA), so that it may control the data driving operation at a suitable time according to the scanning.

The controller (CTR) may receive the timing signals including a vertical synchronization signal (Vsync), a horizontal synchronization signal (Hsync), an input data enable signal (DE), a clock signal (CLK) and the like from an external device (e.g., a host system), may generate various control signals, and may output the generated control signals to the data driver (DDR) and the gate driver (GDR) in order to control the data driver (DDR) and the gate driver (GDR).

For example, in order to control the gate driver (GDR), the controller (CTR) may output various gate control signals (GCS) including a gate start pulse (GSP), a gate shift clock (GSC), a gate output enable signal (GOE) and the like. In addition, in order to control the data driver (DDR), the controller (CTR) may output various data control signals (DCS) including a source start pulse (SSP), a source sampling clock (SSC), a source output enable signal (SOE) and the like.

The controller (CTR) may be a timing controller used in a general display device, or may be a controller capable of further performing other control functions including a timing control. The controller (CTR) may be implemented as a separate component from the data driver (DDR), or may be implemented an integrated circuit integrated with the data driver (DDR).

The data driver (DDR) may receive the image data (DATA) from the controller (CTR) and may supply the data voltages to the plurality of data lines (DL) to drive the plurality of data lines (DL). The data driver (DDR) may be also referred to as a source driver. The data driver (DDR) may exchange various signals with the controller (CTR) through various types of interfaces.

The gate driver (GDR) may sequentially drives the plurality of gate lines (GL) by sequentially providing scan signals to the plurality of gate lines (GL). The gate driver (GDR) may be also referred to as a scan driver. The gate driver (GDR) sequentially provides the scan signal having an ON voltage or an OFF voltage to the plurality of gate lines (GL) in accordance with the control of the controller (CTR).

When a specific gate line is opened by the gate driver (GDR), the data driver (DDR) converts the image data (DATA) received from the controller (CTR) into the data voltage of an analog form and provides the data voltage to the plurality of data lines (DL).

The data driver (DDR) may be located only on one side (for example, on the upper side or the lower side) of the panel (PNL) or may be located on both sides (for example, on the upper side and the lower side) of the panel (PNL), depending on the driving method and the panel design method. Similarly, the gate driver (GDR) may be located only on one side (for example, the left side or the right side) of the panel (PNL) or may be located on both sides (for example, the left side and the right side) of the panel (PNL), depending on the driving method and the panel design method.

The data driver (DDR) may be implemented including one or more source driver integrated circuits (SDICs). Each of the source driver integrated circuit (SDIC) may include a shift register, a latch circuit, a digital to analog converter (DAC), an output buffer and the like. The data driver (DDR) may further include one or more analog to digital converters (ADCs).

Each source driver integrated circuit (SDIC) may be connected to a bonding pad of a panel (PNL) in a TAB (Tape Automated Bonding) type or a COG (Chip On Glass) type, or may be disposed directly on the panel (PNL). In some cases, each source driver integrated circuit (SDIC) may be integrated and disposed on the panel (PNL). In addition, each source driver integrated circuit (SDIC) may be implemented as a COF (Chip On Film) type. In this case, each source driver integrated circuit (SDIC) may be mounted on a circuit film and may be electrically connected to the data lines (DL) in the panel (PNL) through the circuit film.

The gate driver (GDR) may include a plurality of gate drive circuits (GDC). The plurality of gate drive circuits (GDC) may correspond to each of the plurality of gate lines (GL), respectively. Each gate drive circuit (GDC) may include a shift register, a level shifter and the like.

Each gate drive circuit (GDC) may be connected to the bonding pad of the panel (PNL) in the form of a TAB (Tape Automated Bonding) type or a COG (Chip On Glass) type. In addition, each gate drive circuit (GDC) may be implemented by the COF (Chip On Film) method. In this case, each gate drive circuit (GDC) may be mounted on the circuit film and may be electrically connected to the gate lines (GL) in the panel PNL through the circuit film. Also, each gate drive circuit (GDC) may be implemented as the GIP (Gate In Panel) type and may be incorporated in the panel (PNL). That is, each gate drive circuit (GDC) may be formed directly on the panel (PNL).

Figure 2:
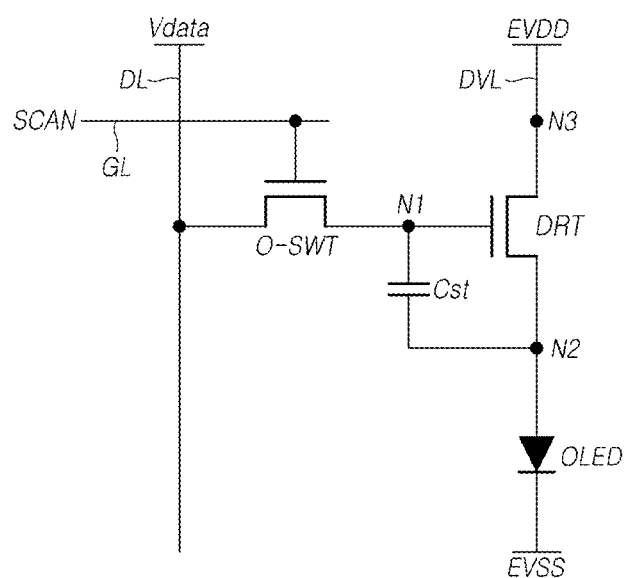
FIG. 2 illustrates the structure of subpixels in an example where the panel according to embodiments of the present disclosure is an OLED (Organic Light Emitting Diode) panel.

FIG. 2 illustrates the structure of the subpixel (SP) in the case that the panel (PNL) according to embodiments of the present disclosure is an OLED (Organic Light Emitting Diode) panel. With reference to FIG. 2, each subpixel (SP) in the panel 110 as the OLED panel may include an organic light emitting diode (OLED), a driving transistor (DRT) for driving the organic light emitting diode (OLED), a switching transistor (O-SWT) electrically connected between the first node N1 of the driving transistor (DRT) and the corresponding data line (DL), and a storage capacitor (Cst) electrically connected between the first node N1 and the second node N2 of the driving transistor (DRT).

The organic light emitting diode (OLED) may include an anode electrode, an organic light emitting layer, a cathode electrode and the like. In accordance with the circuit of FIG. 2, the anode electrode (also referred to as a pixel electrode) of the organic light emitting diode (OLED) may be electrically connected to the second node N2 of the driving transistor (DRT). A base voltage (EVSS) may be applied to the cathode electrode (also referred to as a common electrode) of the organic light emitting diode OLED.

The base voltage (EVSS) may be, for example, a ground voltage or a voltage higher or lower than the ground voltage. Furthermore, the base voltage (EVSS) may be varied depending on the driving state. For example, the base voltage (EVSS) during image driving mode may be set to be different from the base voltage (EVSS) during sensing driving mode.

The driving transistor (DRT) may drive the organic light emitting diode (OLED) by supplying the driving current to the organic light emitting diode (OLED). The driving transistor (DRT) may include the first node N1, the second node N2, the third node N3, and the like.

The first node N1 of the driving transistor (DRT) may be a gate node and may be electrically connected to a source node or a drain node of the switching transistor (O-SWT). The second node N2 of the driving transistor (DRT) may be a source node or a drain node and may be electrically connected to an anode electrode (or a cathode electrode) of the organic light emitting diode (OLED). The third node N3 of the driving transistor (DRT) may be a drain node or a source node and may be electrically connected to a driving voltage line (DVL) for supplying the driving voltage (EVDD).

The storage capacitor (Cst) may be electrically connected between the first node N1 and the second node N2 of the driving transistor (DRT) to maintain the data voltage (Vdata) corresponding to the image signal voltage or a voltage corresponding to the data voltage for one frame time period (or a predetermined time period).

The drain node or the source node of the switching transistor (O-SWT) may be electrically connected to the corresponding data line (DL), and the source or drain node of the switching transistor (O-SWT) may be connected to the first node N1 of the driving transistor (DRT). The gate node of the switching transistor (O-SWT) may be electrically connected to the corresponding gate line (GL) to receive the scan signal (SCAN).

The switching transistor (O-SWT) may be controlled to be turned on and off by receiving the scan signal (SCAN) through the corresponding gate line to the gate node. The switching transistor (O-SWT) may be turned on by the scan signal (SCAN) to transfer the data voltage (Vdata) supplied from the corresponding data line (DL) to the first node N1 of the driving transistor (DRT).

Meanwhile, the storage capacitor (Cst) may be not a parasitic capacitance (for example, Cgs, Cgd), which is an internal capacitor existing between the first node N1 and the second node N2 of the driving transistor DRT. Instead, the storage capacitor (Cst) may be an external capacitor intentionally designed outside the driving transistor (DRT).

Each of the driving transistor (DRT) and the switching transistor (O-SWT) may be an n-type transistor or a p-type transistor.

Each subpixel structure as illustrated in FIG. 2 is a 2T (Transistor) 1C (Capacitor) structure, which is an illustrative example. Therefore, the subpixel according to the present embodiments may further include one or more transistors and one or more capacitors in some cases. Alternatively, each of the plurality of subpixels may have the same structure, and some of the plurality of subpixels may have a different structure.

Figure 3:
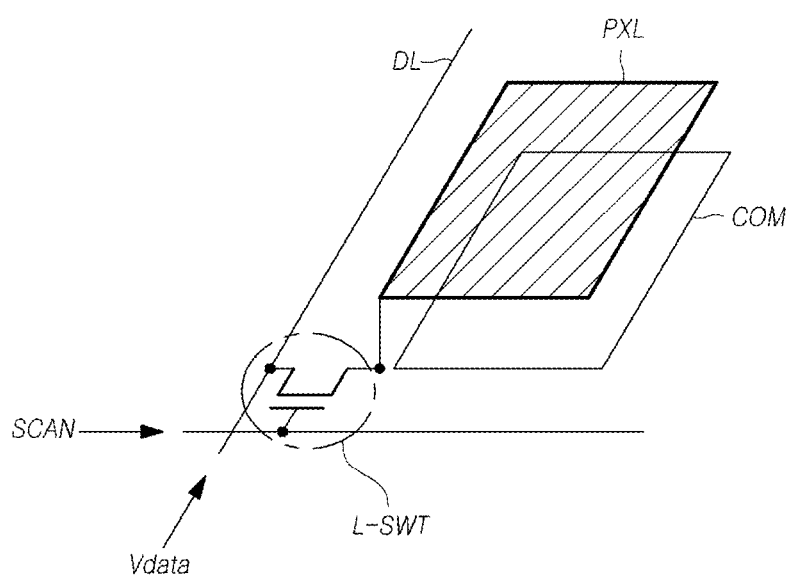
FIG. 3 illustrates the structure of subpixels in an example where the panel according to embodiments of the present disclosure is an LCD (Liquid Crystal Display) panel.

FIG. 3 illustrates the structure of the subpixel (SP) in the case that the panel (PNL) according to embodiments of the present disclosure is a LCD (Liquid Crystal Display) panel. With reference to FIG. 3, each subpixel (SP) in the panel 110 as the LCD panel may include a pixel electrode (PXL), a switching transistor (L-SWT) and the like.

The switching transistor (L-SWT) may be controlled by the scan signal (SCAN) and may be electrically connected between the data line (DL) and the pixel electrode (PXL).

The switching transistor (L-SWT) may be turned on by the scan signal (SCAN) to transfer the data voltage (Vdata) supplied from the data line (DL) to the pixel electrode (PXL). The pixel electrode (PXL) to which the data voltage Vdata is applied may form an electric field with the common electrode (COM) applying a common voltage. That is, a capacitor (storage capacitor) may be formed between the pixel electrode (PXL) and the common electrode (COM).

The panel in accordance with embodiments of the present disclosure may include a substrate, a transistor and a capacitor.

With reference to FIG. 2, the transistor of the panel may be a switching transistor (O-SWT) or a driving transistor (DRT), and the capacitor of the panel may be a storage capacitor (Cst).

Furthermore, with reference to FIG. 3, the transistor of the panel may be a switching transistor (L-SWT), and the capacitor of the panel may include the pixel electrode PXL and the common electrode COM as the first plate and the second plate of the capacitor, respectively.

Figure 4:
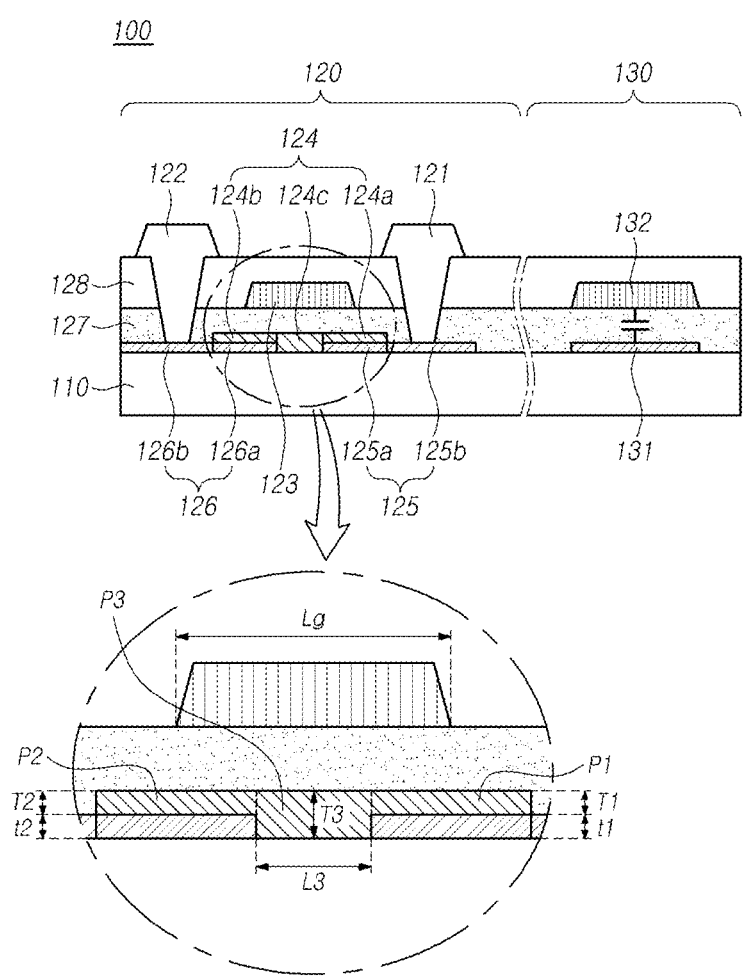
FIG. 4 illustrates the panel according to an embodiment of the present disclosure.
Figure 6:
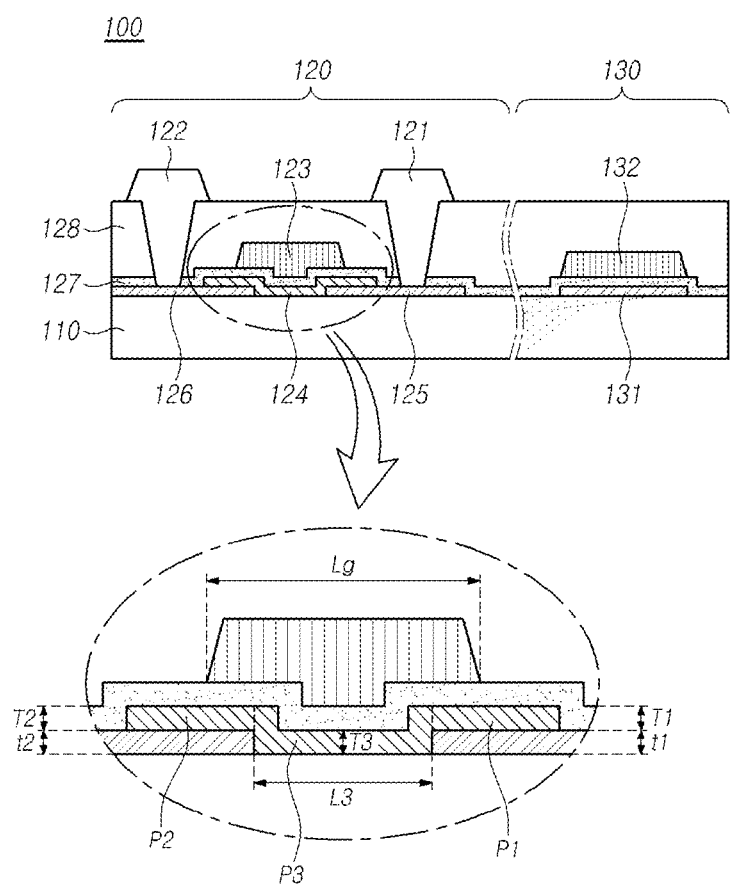
FIG. 6 illustrates the panel according to another embodiment of the present disclosure.
Figure 7:
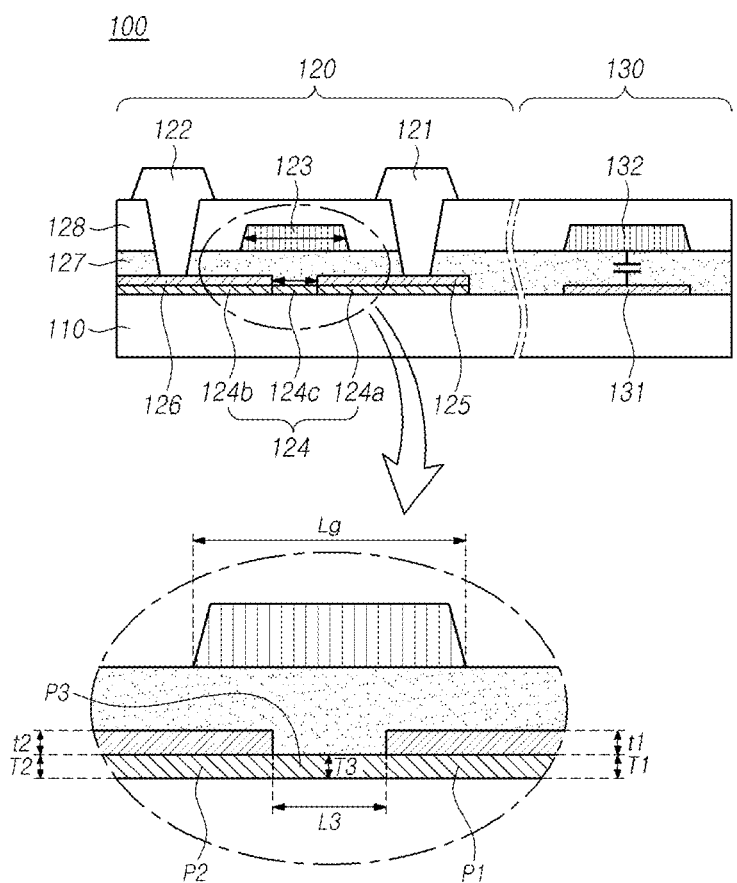
FIG. 7 illustrates a panel according to yet another embodiment of the present invention.

FIGS. 4, 6, and 7 illustrate the panel 100 in accordance with embodiments of the present disclosure. Hereinafter, the panel 100 according to the embodiments of the present disclosure will be described with reference to FIGS. 4, 6, and 7.

The transistor 120 may be disposed on the substrate 110 and may include a source electrode 121, a drain electrode 122, a gate electrode 123, a gate insulation layer 127, and an active layer 124.

The transistor 120 may further include an auxiliary source electrode 125 for electrically connecting one end of the active layer 124 to the source electrode 121 and an auxiliary drain electrode 126 for electrically connecting the other end of the active layer 124 to the drain electrode 122.

Because the transistor 120 includes the auxiliary source electrode 125 and the auxiliary drain electrode 126, it may be possible to implement the structure in which the channel length of the transistor 120 can be shortened, and to provide the panel including the transistor having excellent electron mobility.

The capacitor 130 is disposed on the substrate 110 and may include a first plate 131 and a second plate 132. The first plate 131 of the capacitor 130 may be formed of the same material as the auxiliary source electrode 125 and the auxiliary drain electrode 126.

In this disclosure, the feature that any component of the panel is made of the same material as another components may include the further meaning that the components are formed by patterning from a single layer formed by a same deposition step in the patterning process for manufacturing the panel, as well as the meaning that components are composed of a same material.

Therefore, the first plate 131, the auxiliary source electrode 125, and the auxiliary drain electrode 126 of the capacitor 130 may be formed of the same material. In addition, although the composition of these elements may be somewhat different, if this difference in composition is only a difference in composition of a typical degree that can occur in the process of forming the first plate 131, the auxiliary source electrode 125, and the auxiliary drain electrode 126 by patterning the thin film formed by a single deposition step, it may mean that the first plate 131, the auxiliary source electrode 125, and the auxiliary drain electrode 126 are made of the same material.

Because the first plate 131 of the capacitor 130 is formed of the same material as the auxiliary source electrode 125 and the auxiliary drain electrode 126 of the transistor 120 as described above, the process steps for forming these elements may be reduced.

The gate insulation layer 127 may be a dielectric formed between the gate electrode 123 and the active layer 124 and formed extending between the first plate 131 and the second plate 132 of the capacitor 130.

That is, the gate insulation layer 127 is not only formed in the region corresponding to the gate between the gate and the active layer 124, but is also formed and located at the region between the first plate 131 and the second plate 132 and covering the auxiliary source electrode 125 and the auxiliary drain electrode 126 and the first plate 131. In the case that the gate insulation layer 127 is formed as described above, the gate electrode 123 and the second plate 132 may be formed in the same deposition step as described later, so that the gate insulation layer 127 may also serve as a dielectric between the first plate 131 and the second plate 132.

Because the gate insulation layer 127 is not formed only in the region corresponding to the gate electrode 123, an etching process generally performed after the deposition of a gate insulation layer may be not required. Therefore, problems such as deterioration of the physical properties of the active layer 124, the auxiliary source electrode 125, and the auxiliary drain electrode 126, which may be caused by the etching process performed after the deposition of the gate insulation layer 127, may be solved.

Furthermore, the thickness of the gate insulation layer 127 may be thinner so that the gate electrode 123 can easily form an electric field in the active layer 124. Therefore, it may be possible to secure the capacitance of the capacitor, and to provide an electronic device including the panel with a high aperture ratio.

The active layer 124 may be composed of an oxide semiconductor. The oxide semiconductor constituting the active layer 124 may be an N-type oxide semiconductor such as IGZO (Indium Gallium Zinc Oxide), IZO (Indium Zinc Oxide), or ITZO (Indium Tin Zinc Oxide), or an P-type oxide semiconductor such as CuOx, SnOx, NiOx or the like.

In the case that the active layer 124 is made of an oxide semiconductor, it may be possible to provide a panel having an excellent electron mobility and an improved aperture ratio, and it may be possible to provide the panel with reduced leakage current and improved power consumption.

The auxiliary source electrode 125, the auxiliary drain electrode 126, and the first plate 131 may be formed of a metal electrode or a conductive oxide semiconductor, respectively. The type of the metal electrode may not be particularly limited as long as it can be used as an electrode. The conductive oxide semiconductor may also not be limited as long as it has a lower specific resistance than the active layer and may be used as an electrode. For example, ITO (Indium Tin Oxide), IZO (Indium Zinc Oxide), ZnO, SnO2, TiO2, GZO(Ga-doped ZnO), and AZO(Al-doped ZnO) may be used as the conductive oxide semiconductor.

In the case that the active layer 124 is made of the oxide semiconductor and at least one of the auxiliary source electrode 125, the auxiliary drain electrode 126, and the first plate 131 is made of a conductive oxide semiconductor, the conductive oxide semiconductor may be composed of a material different from the oxide semiconductor constituting the active layer 124. In an embodiment, the auxiliary source electrode 125, the auxiliary drain electrode 126, and the first plate 131 are made of a material having a lower specific resistance than that of the active layer 124. Therefore, the auxiliary source electrode 125, the drain electrode 126, and the first plate 131 may be composed of a conductive oxide semiconductor having a lower resistivity than the oxide semiconductor used for the active layer 124.

The separation distance between the auxiliary source electrode 125 and the auxiliary drain electrode 126 may be less than or equal to the length of the gate electrode 123. Therefore, the transistor 120 according to the embodiments of the present disclosure may have a channel length shorter than that of the transistor including the gate electrode 123 having a length corresponding to a channel length of the semiconductor, and thereby the electron mobility may be more enhanced.

The gate electrode 123 of the transistor 120 and the second plate 132 of the capacitor 130 may be made of the same material. The feature that the gate electrode 123 of the transistor 120 and the second plate 132 of the capacitor 130 are made of the same material should be interpreted similarly to the feature that the first plate 131 of the capacitor 130, the auxiliary source electrode 125, and the auxiliary drain electrode 126 are made of the same material, as described above. Therefore, the gate electrode 123 of the transistor 120 and the second plate 132 of the capacitor 130 may be made of the same material. In addition, although the composition of these elements is somewhat different, if this difference in composition is only a difference in composition of a typical degree that can occur in the process of forming the gate electrode 123 and the second plate 132 by patterning the thin film formed by a single deposition step, it may mean that the gate electrode 123 and the second plate 132 are made of the same material.

Hereinafter, the transistor 120 included in the panel 100 according to the embodiment of the present disclosure as shown in FIG. 4 will be described.

The transistor 120 may be formed such that the auxiliary source electrode 125 is disposed on the substrate 110, and the auxiliary drain electrode 126 is disposed apart from the auxiliary source electrode 125 on the substrate 110. For example, as shown in FIG. 4, the auxiliary drain electrode 126 and the auxiliary source electrode 125 are disposed on the substrate 110, but do not directly contact each other.

One end of the active layer 124 may contact the end of the auxiliary source electrode 125, and the other end of the active layer 124 may contact the end of the auxiliary drain electrode 126. As shown in FIG. 4, the active layer 124 is disposed in the region between the auxiliary source electrode 125 and the auxiliary drain electrode 126 spaced apart from each other. In addition, one end of the active layer 124 may contact the end portion of the auxiliary source electrode 125, and the other end of the active layer 124 may contact the end portion of the auxiliary drain electrode 126.

Therefore, the distance between the auxiliary source electrode 125 and the auxiliary drain electrode 126 may be equal to or less than the length of the gate electrode 123, as described above.

The panel 100 shown in FIG. 4 may include, for example, an OLED subpixel having the structure shown in FIG. 2. In the case that the panel 100 shown in FIG. 4 includes the subpixel shown in FIG. 2 as an example, the transistor 120 of the panel 100 may be the driving transistor (DRT) shown in FIG. 2, and the capacitor 130 of the panel 100 may be the storage capacitor (Cst) shown in FIG. 2. When the transistor 120 of FIG. 4 is the driving transistor (DRT) of FIG. 2, the gate electrode 123 of FIG. 4 may be electrically connected to the second plate 132 of the capacitor 130 of FIG. 4, and the source electrode 121 of FIG. 4 may be electrically connected to the first plate 131 of FIG. 4 at the second node N2 of FIG. 2.

In another example, the transistor 120 of the panel 100 may be the switching transistor (O-SWT) shown in FIG. 2, and the capacitor 130 of the panel 100 may be the storage capacitor (Cst) of FIG. 2. When the transistor 120 of FIG. 4 is the switching transistor (O-SWT) of FIG. 2, the source electrode 121 of FIG. 4 may be electrically connected to the second plate 132 of the capacitor 130 of FIG. 4, and the first plate 131 of the capacitor 130 of FIG. 4 may be electrically connected to the source electrode 121 of the driving transistor (DRT) of FIG. 2 at the second node N2.

The panel 100 shown in FIG. 4 may include, for example, an LCD subpixel having the structure shown in FIG. 3. In the case that the panel 100 shown in FIG. 4 includes the subpixel shown in FIG. 3 as an example, the transistor 120 of the panel 100 may be the switching transistor (L-SWT) in FIG. 3. In addition, when the drain electrode 122 of FIG. 4 is connected to the second plate 132 of the capacitor 130 of FIG. 4, the first plate 131 of the capacitor 130 of FIG. 4 may be the common electrode (COM) of FIG. 2.

In another example, the transistor 120 of the panel 100 may be the switching transistor (L-SWT) in FIG. 3. In addition, when the drain electrode 122 of FIG. 4 is connected to the first plate 131 of the capacitor 130 of FIG. 4, the second plate 132 of the capacitor 130 of FIG. 4 may be the common electrode (COM) of FIG. 2.

Figure 5:
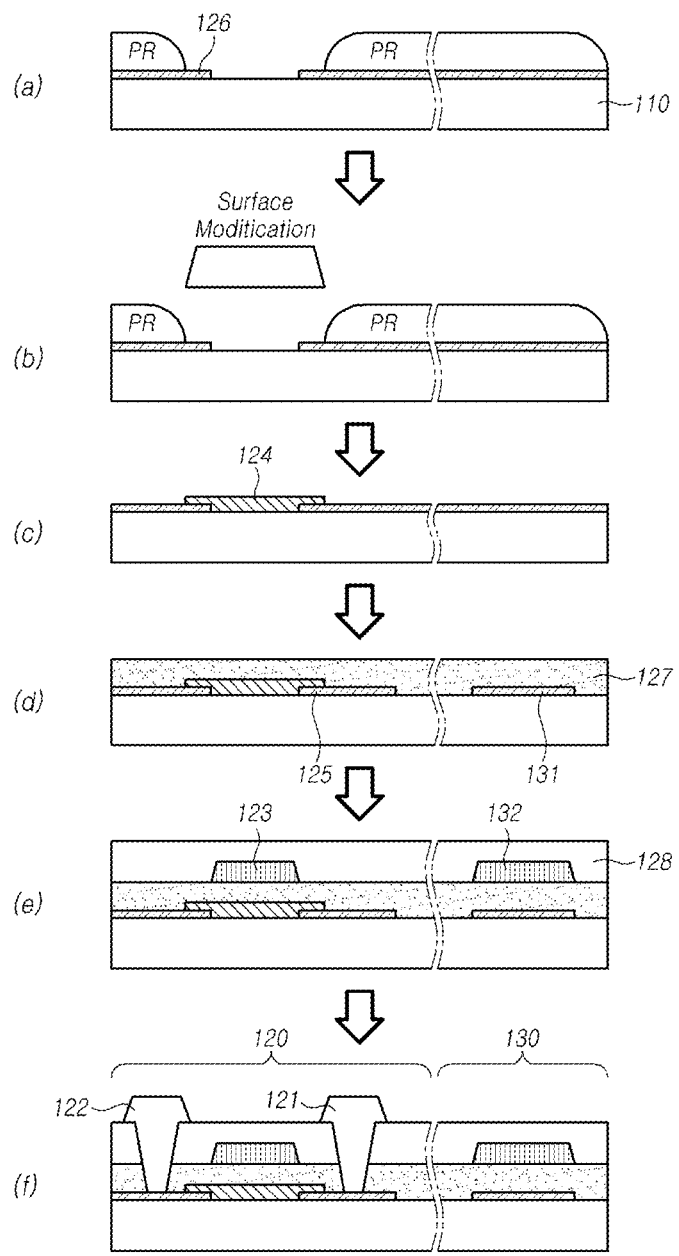
FIG. 5 is a diagram schematically illustrating processes for manufacturing the panel shown in FIG. 4 according to embodiments of the present disclosure.

FIG. 5 schematically illustrates an example process for manufacturing the panel 100 shown in FIG. 4.

FIG. 5 part (a) illustrates a state in which a patterning process is performed on an oxide semiconductor thin film deposited on a substrate 110. The oxide semiconductor thin film may be deposited on the substrate 110 by, for example, a sputtering process. The thin film deposited by the sputtering process may form the auxiliary source electrode 125, the auxiliary drain electrode 126, and the first plate 131, which are made of the same material, by a patterning process to be described later. After the sputtering process, the pattern as shown in FIG. 5 part (a) is formed on the substrate 110 by a patterning process.

FIG. 5 part (b) illustrates a step of performing surface modification on the substrate 110 of FIG. 5 part (a). The surface modification may be a surface treatment for deposition using a selective area growth method as described with reference to FIG. 5 part (c)—for example, a surface treatment by a µ-plasma.

FIG. 5 part (c) illustrates a process of stripping a photoresist after the surface modification process, and performing a MOCVD (Metal-Organic Chemical Vapor Deposition) method or ALD (Atomic Layer Deposition) method using a selective area growth method to form the active layer 124.

The deposition using the selective area growth method is a technique in which a thin film is deposited only on the surface performed by surface modification. Therefore, after the surface modification is performed as shown in FIG. 5 part (b), the active layer 124 may be formed as shown in FIG. 5 part (c) by stripping the photoresist and performing the deposition process.

A MOCVD (Metal-Organic Chemical Vapor Deposition) process is a type of CVD (Chemical Vapor Deposition) in which a raw material gas flows out on a high temperature substrate to cause a decomposition reaction on the surface to form a thin film. That is, this is a technique in which an organic metal complex is contained in a raw material gas, and the organic metal gas is pyrolyzed on the heated substrate to grow a semiconductor thin film. In the case of the MOCVD method, it may be possible to operate a film at a lower temperature than that of the CVD using a halogenide halide gas, and to obtain a uniform film capable of controlling thin films at the atomic unit. As a result, it may be advantageous for forming a uniform film having a high density and few defects.

The ALD (Atomic Layer Deposition) process is a deposition method in which particles formed by a chemical reaction between reactive gases are deposited on the surface of the substrate to form a thin film by separating and supplying the respective reaction materials. In this method, after one chemical reaction material is chemically adsorbed on the substrate on which the thin film is to be deposited, a second or third gas is chemically absorbed on the substrate, and each adsorption may preformed by one atomic layer level.

In the case that such an MOCVD or ALD method is utilized, although the productivity and growth rate of the thin film may be somewhat reduced, the thin film deposition performance may be enhanced in comparison with the general PVD (Physical Vapor Deposition) and other general CVD (Chemical Vapor Deposition), and thereby fine control of thin film thickness may be possible. That is, in the case of MOCVD or ALD process, a thin film having excellent step coverage characteristics may be formed.

Therefore, the active layer 124 formed by the MOCVD method or the ALD method may have a higher density and a lower thickness non-uniformity than the auxiliary source electrode 125, the auxiliary drain electrode 126, and the first plate 131 formed by patterning the thin film deposited by sputtering.

FIG. 5 part (d) illustrates the step of forming the gate insulation layer 127, and FIG. 5 part (e) illustrates the step of forming the gate electrode 123 and the second plate 132, as well as forming the interlayer insulation film 128.

As shown in FIG. 5 part (d) and FIG. 5 part (e), the gate insulation layer 127 is formed to cover the auxiliary source electrode 125, the auxiliary drain electrode 126, and the first plate 131, and then the gate electrode 123 and the second plate 132 are formed. Accordingly, the panel 100 of the present embodiment may be advantageous in that the gate insulation layer 127 is not required to be etched separately. In addition, the gate insulation layer 127 is disposed between the first plate 131 and the second plate 132 of the capacitor 130 and may also serve as a dielectric. Accordingly, the panel 100 of the present embodiment may secure the capacitance of the capacitor 130 in the case that the gate insulation layer 127 is formed thin, and thereby it may be possible to provide an electronic device having an excellent aperture ratio.

FIG. 5 part (f) illustrates a step for forming a hole in the interlayer insulation film 128 and the gate insulation layer, and for forming the transistor 120 and the capacitor 130 by contacting the source electrode 121 and the auxiliary source electrode 125 through the hole and by contacting the drain electrode 122 and the auxiliary drain electrode 126 through the hole.

As described above with reference to FIG. 5, the panel 100 according to an embodiment of the present disclosure may have the advantage that the panel may be manufactured by a simpler process.

With reference to FIG. 4, the active layer 124 may include the first part (P1) having the auxiliary source electrode 125 disposed at a lower portion thereof, the second part (P2) having the auxiliary drain electrode 126 disposed at a lower portion thereof, and the third part (P3) between the first part (P1) and the second part (P2).

The auxiliary source electrode 125 may include a source-active area 125a which overlaps the first part (P1) of the active layer 124, and the auxiliary drain electrode 126 may include a drain-active area 126a which overlaps with the second part (P2) of the active layer 124. Because the auxiliary source electrode 125 includes the source-active area 125a and the auxiliary drain electrode 126 includes the drain-active area 126a, the active layer 124 and the auxiliary source electrode or the auxiliary drain electrode can contact each other over a larger area, and thereby it may be advantageous in that the contact resistance can be greatly reduced.

The separation distance between the auxiliary source electrode 125 and the auxiliary drain electrode 126 may be less than or equal to the length of the gate electrode 124 so that the length of the third part (P3) may be less than or equal to the length (Lg) of the gate electrode. Therefore, the transistor may have excellent conductive characteristics in the channel region of the active layer.

The thickness T3 of the third part may be equal to or greater than the thickness T1 of the first part and the thickness T2 of the second part. Therefore, the thickness T3 of the third part may be equal to or greater than the thickness of each of the first and second parts.

The length L3 of the third part corresponds to the channel length of the semiconductor. The shorter the channel region, the better the conductivity of the semiconductor. In addition, when the length L3 of the third part is shortened in order to shorten the channel region, the thickness of the third part (P3) may become thicker than the thicknesses of the first part (P1) and the second part (P2) due to the process margin of the process for forming the semiconductor layer 124 by filling the spacing region between the auxiliary source electrode 125 and the auxiliary drain electrode 126. As a result, the length L3 of the third part may be shortened, so that the conductive characteristics of the transistor can be improved.

Because the active layer 124 may be formed by the MOCVD method or the ALD method, and the auxiliary source electrode 125 and the auxiliary drain electrode 126 may be formed by sputtering, the thickness T1 of the first part may be equal to or less than the thickness t1 of the auxiliary source electrode and the thickness T2 of the second part may be equal to or less than the thickness t2 of the auxiliary drain electrode. In addition, because the active layer 124 is formed by the MOCVD or ALD method with excellent step coverage, cracks and disconnection may not occur in the active layer, even though the transistor has the thickness relationship as described above.

Hereinafter, the transistor 120 included in the panel 100 according to an embodiment of the present disclosure shown in FIG. 6 will be described.

In comparison with the transistor 120 shown in FIG. 4, the transistor 120 shown in FIG. 6 may include the active layer 124 that may be superior in step to the active layer 124 of the transistor 120 shown in FIG. 4. In the case that the active layer is formed by the MOCVD or ALD method using a selective area growth method as described by example above, the MOCVD and ALD methods may form a layer having the excellent step coverage, so that the active layer 124 as shown in FIG. 6 may be formed.

In addition, because the MOCVD and ALD method may form the layer having a high thickness uniformity, the active layer 124 formed by the MOCVD or ALD method may be formed in order that the thickness T1 of the first part or the thickness T2 of the second part corresponds to the thickness T3 of the third part.

The feature that the thickness of one component corresponds to the thickness of another component in the present specification may include the meaning that the thickness of the two components have slight differences that are regarded as substantially identical under the technical sense of the field of the present disclosure.

In the panel shown in FIG. 6 and as described above, other configurations or features not described may be the same as the corresponding configuration of the panel shown in FIG. 4.

Hereinafter, the transistor 120 included in the panel 100 according to an embodiment of the present disclosure shown in FIG. 7 will be described.

The transistor 120 may includes the area in which the auxiliary source electrode 125 is disposed on the active layer 124, and the area in which the auxiliary drain electrode 126 is disposed apart from the auxiliary source electrode 125 on the active layer 124. For example, all of the auxiliary drain electrode 126 and the auxiliary source electrode 125 may be disposed on the active layer 124 as shown in FIG. 7, or a portion of the auxiliary drain electrode 126 and the auxiliary source electrode 125 may be disposed on the active layer 124 and partially overlap the active layer 124.

The separation distance between the auxiliary source electrode 125 and the auxiliary drain electrode 126 may be equal to or shorter than the length of the gate electrode 123, and it may thereby be possible to provide the transistor 120 having excellent electron mobility and the panel 100 including such transistor 120.

Figure 8:
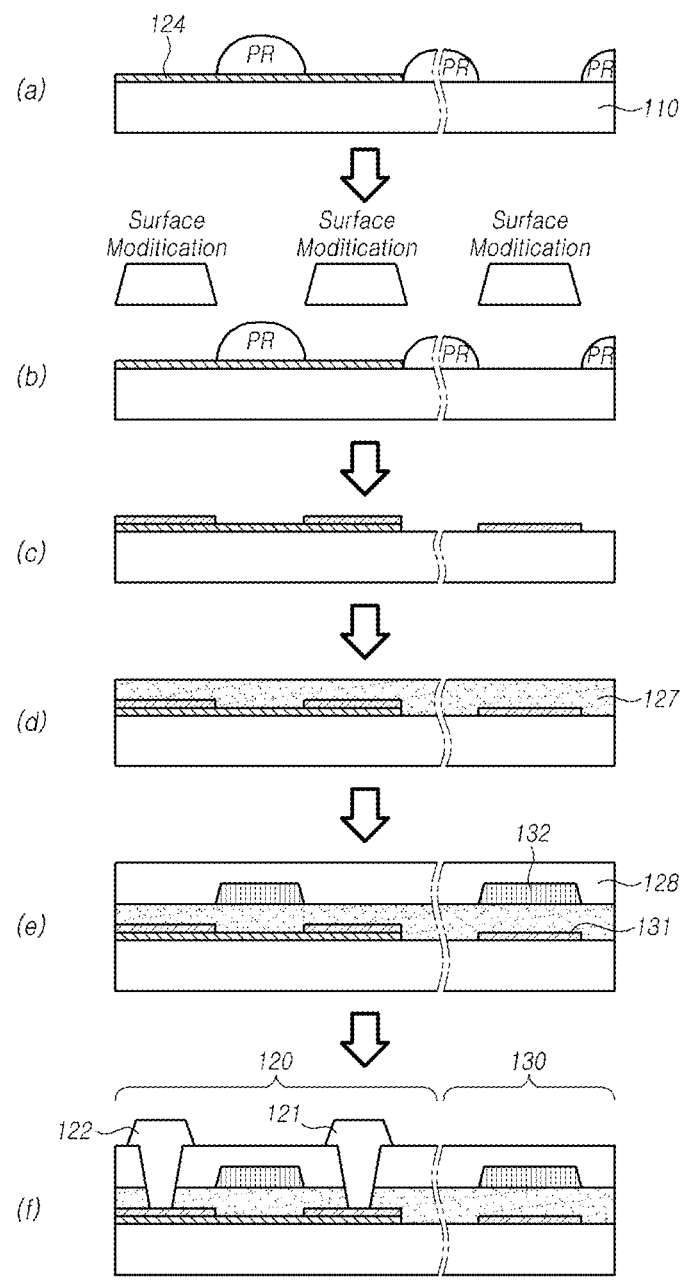
FIG. 8 is a diagram schematically illustrating processes for manufacturing the panel shown in FIG. 7 according to embodiments of the present disclosure.

FIG. 8 is a schematic diagram for explaining an example process for manufacturing the example panel 100 shown in FIG. 7.

FIG. 8 part (a) illustrates a process of performing patterning on an oxide semiconductor thin film deposited on a substrate 110. The oxide semiconductor thin film deposited on the substrate 110 may be deposited by, for example, a sputtering process. The pattern as shown in FIG. 8 part (a) may be formed on the substrate 110 by a patterning process after the sputtering process.

FIG. 8 part (b) illustrates a step for performing surface modification on the substrate 110 of FIG. 8 part (a). The surface modification may be a surface treatment process for deposition using the selective area growth method described above.

FIG. 8 part (c) illustrates a step for stripping the photoresist after the surface modification process, and forming the auxiliary source electrode 125, the auxiliary drain electrode 126, and the first plate 131 by using MOCVD (Metal-Organic Chemical Vapor Deposition) method or using ALD (Atomic Layer Deposition) method using the selective area growth method as described above. The auxiliary source electrode 125, the auxiliary drain electrode 126, and the first plate 131 may be formed of the same material by the same deposition step as shown in FIG. 8 part (c). Therefore, the panel 100 according to an embodiment of the present disclosure may be produced by a simple process.

In addition, the auxiliary source electrode 125, the auxiliary drain electrode 126, and the first plate 131 formed by the MOCVD method or the ALD method may have a higher density and a lower thickness non-uniformity than the active layer 124 formed by patterning the thin film deposited by sputtering.

FIG. 8 part (d) illustrates a step of forming the gate insulation layer 127. FIG. 8 part (e) illustrates a step of forming the gate electrode 123 and the second plate 132 and forming the interlayer insulation film 128.

As illustrated in FIG. 8 parts (d) and (e), because the gate insulation layer 127 is formed so as to cover the auxiliary source electrode 125, the auxiliary drain electrode 126, and the first plate 131, and then the gate electrode 123 and the second plate 132 are formed on the gate insulation layer 127, the panel 100 of the present embodiment may have an advantage in that the etching process for the gate insulation layer 127 may not be required. In addition, because the gate insulation layer 127 is positioned between the first plate 131 and the second plate 132 of the capacitor 130 and the gate insulation layer 127 may serve as a dielectric, it may be possible to secure the capacitance of the capacitor 130 and to provide the electronic device having an excellent aperture ratio.

FIG. 8 part (f) illustrates a step of forming the hole in the interlayer insulation film 128, and forming the transistor 120 by contacting the source electrode 121 to the auxiliary source electrode 125 through the hole and by contacting the drain electrode 122 to the auxiliary drain electrode 126 through the hole.

As described above with reference to FIG. 8, the panel 100 according to an embodiment of the present disclosure may have an advantage that the panel can be manufactured by a simpler process.

With reference to FIG. 7, the active layer 124 may include the first part (P1) having the auxiliary source electrode disposed on an upper portion thereof, the second part (P2) having the auxiliary drain electrode disposed on an upper portion thereof, and the third part (P3) between the first part (P1) and the second part (P2).

Because the active layer 124 includes the first part (P1) and the second part (P2), the active layer 124 and the auxiliary source electrode or the auxiliary drain electrode may contact each other over a larger area, and contact resistance may thereby be greatly reduced.

In addition, because the distance between the auxiliary source electrode 125 and the auxiliary drain electrode 126 may be less than or equal to the length of the gate electrode 123, the length of the third part (P3) may be equal to or shorter than the length (Lg) of the gate electrode. Therefore, the transistor may secure excellent conductive characteristics in the channel region of the active layer.

The auxiliary source electrode 125 and the auxiliary drain electrode 126 may be formed by the MOCVD method or the ALD method, and the active layer 124 can be formed by sputtering, so that the thickness (T1) of the first part may be equal to or greater than the thickness (t1) of the auxiliary source electrode, and the thickness (T2) of the second part may be equal to or less than the thickness (t2) of the auxiliary drain electrode.

In accordance with another aspect of the present disclosure, there may be provided the electronic device including the panel and the driving circuit for driving the panel.

The configuration of the panel included in the electronic device according to embodiments of the present disclosure may be the same as the configuration of the panel according to embodiment of the present disclosure described above, and thus, a detailed description thereof will be omitted.

In addition, the driving circuit may be the same as that described in the above-described example electronic device of the present disclosure, and a detailed description thereof will be omitted.

In accordance with another aspect of the present disclosure, there may be provided a transistor including the auxiliary source electrode, the auxiliary drain electrode, the active layer, the gate insulation layer, the gate electrode, the interlayer insulation film, the source electrode, and the drain electrode.

The configuration of the transistor according to an embodiment of the present disclosure may be the same as that described above for the transistor included in the panel according to an embodiment of the present disclosure, and a detailed description thereof will be omitted.

It will be apparent to those skilled in the art that various modifications and variations can be made in the panel, electronic device and transistor of the present disclosure without departing from the spirit or scope of the disclosure. Thus, it is intended that the present disclosure cover the modifications and variations of this disclosure provided they come within the scope of the appended claims and their equivalents.

What is claimed is:

1. A panel, comprising:
a substrate;
a transistor disposed on the substrate and including:
a source electrode,
a drain electrode,
a gate electrode,
a gate insulation layer,
an active layer,
an auxiliary source electrode configured to electrically connect one end of the active layer to the source electrode, and
an auxiliary drain electrode configured to electrically connect another end of the active layer to the drain electrode; and
a capacitor disposed on the substrate and including a first plate and a second plate,
wherein the first plate of the capacitor is made of a same material as the auxiliary source electrode and the auxiliary drain electrode,
wherein at least one of the auxiliary source electrode and the auxiliary drain electrode is formed of a metal or a conductive oxide including one of Indium Tin Oxide (ITO), Indium Zinc Oxide (IZO), ZnO, SnO2, TiO2, Ga-doped ZnO (GZO), and Al-doped ZnO (AZO),
wherein the first plate of the capacitor is spaced apart from the auxiliary source electrode electrically connecting the active layer to the source electrode and the auxiliary drain electrode electrically connecting the active layer to the drain electrode, and does not overlap with any of the source electrode and the drain electrode in a plain view, and
wherein a distance between the auxiliary source electrode and the auxiliary drain electrode is less than a length of the gate electrode.

2. The panel of claim 1, wherein the gate insulation layer is composed of a dielectric and is between the gate electrode and the active layer to extend between the first plate and the second plate.

3. The panel of claim 1, wherein the active layer is composed of an oxide semiconductor.

4. The panel of claim 3, wherein each of the auxiliary source electrode, the auxiliary drain electrode, and the first plate is composed of the metal the conductive oxide.

5. The panel of claim 4, wherein:
the conductive oxide is composed of a material different from the oxide semiconductor constituting the active layer.

6. The panel of claim 1, wherein the gate electrode of the transistor and the second plate of the capacitor are composed of a same material.

7. The panel of claim 1, wherein:
the auxiliary source electrode is disposed on the substrate;
the auxiliary drain electrode is disposed on the substrate apart from the auxiliary source electrode; and
the one end of the active layer contacts an end of the auxiliary source electrode and the other end of the active layer contacts another end of the auxiliary drain electrode.

8. The panel of claim 7, wherein the active layer includes:
a first part, wherein the auxiliary source electrode is disposed in a lower part of the first part;
a second part, wherein the auxiliary drain electrode is disposed in a lower part of the second part; and
a third part between the first part and the second part, wherein a length of the third part is less than a length of the gate electrode.

9. The panel of claim 8, wherein a thickness of each of the first part and second part corresponds to a thickness of the third part.

10. The panel of claim 8, wherein a thickness of the third part is equal to or greater than a thickness of each of the first part and the second part.

11. The panel of claim 7, wherein the active layer has a higher density than the auxiliary source electrode, the auxiliary drain electrode, and the first plate.

12. The panel of claim 7, wherein the active layer has a lower thickness non-uniformity than the auxiliary source electrode, the auxiliary drain electrode, and the first plate.

13. The panel of claim 1, wherein:
the transistor includes an area in which the auxiliary source electrode is disposed on the active layer, and includes an area in which the auxiliary drain electrode is disposed on the active layer apart from the auxiliary source electrode.

14. The panel of claim 13, wherein the active layer includes:
a first part, wherein the auxiliary source electrode is disposed in an upper part of the first part;
a second part, wherein the auxiliary drain electrode is disposed in an upper part of the second part; and
a third part between the first part and the second part, wherein a length of the third part is less than a length of the gate electrode.

15. The panel of claim 13, wherein the auxiliary source electrode, the auxiliary drain electrode, and the first plate have a higher density than the active layer.

16. The panel of claim 13, wherein the auxiliary source electrode, the auxiliary drain electrode, and the first plate have a lower thickness non-uniformity than the active layer.

17. An electronic device, comprising:
a panel; and
a driving circuit configured to drive the panel,
wherein the panel includes a substrate, a capacitor disposed on the substrate and including a first plate and a second plate, and a transistor disposed on the substrate, the transistor including:
a source electrode,
a drain electrode,
a gate electrode,
a gate insulation layer,
an active layer,
an auxiliary source electrode configured to electrically connect one end of the active layer to the source electrode, and
an auxiliary drain electrode configured to electrically connect another end of the active layer to the drain electrode,
wherein the first plate of the capacitor is composed of a same material as the auxiliary source electrode and the auxiliary drain electrode,
wherein at least one of the auxiliary source electrode and the auxiliary drain electrode is formed of a metal or a conductive oxide including one of Indium Tin Oxide (ITO), Indium Zinc Oxide (IZO), ZnO, SnO2, TiO2, Ga-doped ZnO (GZO), and Al-doped ZnO (AZO),
wherein the first plate of the capacitor is spaced apart from the auxiliary source electrode electrically connecting the active layer to the source electrode and the auxiliary drain electrode electrically connecting the active layer to the drain electrode, and does not overlap with any of the source electrode and the drain electrode in a plain view, and
wherein a distance between the auxiliary source electrode and the auxiliary drain electrode is less than a length of the gate electrode.

18. A transistor on a substrate, comprising:
an auxiliary source electrode disposed on the substrate;
an auxiliary drain electrode disposed apart from the auxiliary source electrode on the substrate;
an active layer disposed on the substrate and including one end that contacts an end of the auxiliary source electrode and another end that contacts an end of the auxiliary drain electrode;
a gate insulation layer disposed on the active layer;
a gate electrode disposed on the gate insulation layer and overlapping the active layer;
an interlayer insulation film disposed to cover the gate electrode;
a source electrode in contact with the auxiliary source electrode through a hole in the interlayer insulation film and the gate insulation layer; and
a drain electrode in contact with the auxiliary drain electrode through another hole in the interlayer insulation film and the gate insulation layer,
wherein at least one of the auxiliary source electrode and the auxiliary drain electrode is formed of a metal or a conductive oxide including one of Indium Tin Oxide (ITO), Indium Zinc Oxide (IZO), ZnO, SnO2, TiO2, Ga-doped ZnO (GZO), and Al-doped ZnO (AZO),
wherein each of the auxiliary source electrode contacting with the source electrode and the auxiliary drain electrode contacting with the drain electrode is spaced apart from a first plate of a capacitor, the capacitor not overlapping with any of the source electrode and the drain electrode in a plain view, and
wherein a distance between the auxiliary source electrode and the auxiliary drain electrode is less than a length of the gate electrode.

* * * * *